(12) United States Patent
Wang et al.

(10) Patent No.: US 10,505,151 B2
(45) Date of Patent: Dec. 10, 2019

(54) LINEAR POLARIZING LAYER, CIRCULAR POLARIZING LAYER, FLEXIBLE DISPLAY APPARATUS, AND PREPARATION METHODS THEREOF

(71) Applicant: BOE Technology Group Co., Ltd., Beijing (CN)

(72) Inventors: Tao Wang, Beijing (CN); Pao Ming Tsai, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/544,934

(22) PCT Filed: Jan. 24, 2017

(86) PCT No.: PCT/CN2017/072484
§ 371 (c)(1),
(2) Date: Jul. 20, 2017

(87) PCT Pub. No.: WO2017/206533
PCT Pub. Date: Dec. 7, 2017

(65) Prior Publication Data
US 2018/0212200 A1    Jul. 26, 2018

(30) Foreign Application Priority Data

May 30, 2016   (CN) .......................... 2016 1 0368428

(51) Int. Cl.
*H01L 21/00*    (2006.01)
*H01L 51/52*    (2006.01)
(Continued)

(52) U.S. Cl.
CPC ............ *H01L 51/5281* (2013.01); *C09D 4/00* (2013.01); *C09D 129/10* (2013.01);
(Continued)

(58) Field of Classification Search
CPC ............ H01L 51/5281; H01L 51/0097; G02B 5/3083; G02B 5/3025; G02B 5/30;
(Continued)

(56) References Cited

U.S. PATENT DOCUMENTS 3,560,075 A    2/1971  Battista et al.
2004/0228983 A1*  11/2004  Chien .................. G02B 5/3016
                                                    428/1.1
(Continued)

FOREIGN PATENT DOCUMENTS

CN    102778718 A    11/2012
CN    105511006 A     4/2016
(Continued)

OTHER PUBLICATIONS

International Search Report and Written Opinion for International Application No. PCT/CN2017/072484, dated Apr. 21, 2017, 9 pages.

(Continued)

*Primary Examiner* — Ismail A Muse
(74) *Attorney, Agent, or Firm* — Westman, Champlin & Koehler, P.A.

(57) ABSTRACT

This invention discloses a linear polarizing layer, a circular polarizing layer, a flexible display apparatus, and preparation methods thereof. The preparation method of a linear polarizing layer according to this invention comprises the steps of: coating a polarizing film precursor material on a flexible base material, wherein the polarizing film precursor material comprises a polarizing material capable of being oriented under a field effect; orientating the polarizing film precursor material in a manner of field induction to allow the direction of orientation thereof to be vertical to the direction of a bending axis of the flexible base material; and curing the (Continued)

polarizing film precursor material to form a linear polarizing layer on the flexible base material.

20 Claims, 5 Drawing Sheets

(51) Int. Cl.
| | |
|---|---|
| C09D 129/10 | (2006.01) |
| G02B 5/30 | (2006.01) |
| C09D 4/00 | (2006.01) |
| C09D 7/41 | (2018.01) |
| C08K 5/18 | (2006.01) |
| C08K 5/30 | (2006.01) |
| C08K 5/315 | (2006.01) |
| C08K 5/3417 | (2006.01) |
| C08K 5/45 | (2006.01) |
| H01L 51/00 | (2006.01) |
| C08K 5/00 | (2006.01) |

(52) U.S. Cl.
CPC ......... *G02B 5/3025* (2013.01); *G02B 5/3033* (2013.01); *G02B 5/3083* (2013.01); *C08K 5/0041* (2013.01); *C08K 5/18* (2013.01); *C08K 5/30* (2013.01); *C08K 5/315* (2013.01); *C08K 5/3417* (2013.01); *C08K 5/45* (2013.01); *C09D 7/41* (2018.01); *H01L 51/0097* (2013.01); *H01L 2251/5338* (2013.01)

(58) Field of Classification Search
CPC .......... C09D 7/41; C09D 129/10; C08K 5/45; C08K 5/315; C08K 5/30; C08K 5/18; C08K 5/3417
See application file for complete search history.

(56) References Cited

U.S. PATENT DOCUMENTS

| | | | | |
|---|---|---|---|---|
| 2005/0247958 A1* | 11/2005 | Wang | ............... | G02B 5/3016 257/200 |
| 2005/0287355 A1* | 12/2005 | Matayabas, Jr. | ............... | H01L 21/76828 428/323 |
| 2006/0028600 A1* | 2/2006 | Wu | ............... | G02B 5/3016 349/115 |
| 2006/0275557 A1* | 12/2006 | Hisamitsu | ............... | C09K 19/54 428/1.1 |
| 2007/0128382 A1* | 6/2007 | Hayashi | ............... | G02B 5/3016 428/1.31 |
| 2007/0258024 A1* | 11/2007 | Parri | ............... | C09K 19/2007 349/96 |
| 2008/0143943 A1* | 6/2008 | May | ............... | C09K 19/18 349/117 |
| 2008/0203356 A1* | 8/2008 | Kjellander | ............... | G02B 1/04 252/299.01 |
| 2008/0261130 A1* | 10/2008 | Hammond-Smith | .... | B41M 3/14 430/20 |
| 2009/0310218 A1* | 12/2009 | Hane | ............... | C08J 7/047 359/485.01 |
| 2010/0002158 A1* | 1/2010 | Ishihara | ............... | G02F 1/134363 349/33 |
| 2010/0014033 A1* | 1/2010 | Kawasaki | ............... | G02B 5/201 349/117 |
| 2010/0053520 A1* | 3/2010 | Yoon | ............... | G02B 5/3016 349/119 |
| 2010/0068419 A1* | 3/2010 | Kim | ............... | G02B 5/3016 428/1.23 |
| 2011/0030152 A1* | 2/2011 | Watanabe | ............... | G02C 7/12 8/495 |
| 2011/0032437 A1* | 2/2011 | Yoshimi | ............... | G02B 5/3016 349/7 |
| 2011/0177315 A1* | 7/2011 | Iwahashi | ............... | C09B 31/04 428/220 |
| 2011/0178200 A1* | 7/2011 | Parri | ............... | C09K 19/18 522/173 |
| 2012/0027960 A1* | 2/2012 | Xu | ............... | C07D 211/46 428/1.2 |
| 2013/0044286 A1* | 2/2013 | Yoon | ............... | G02F 1/13363 349/194 |
| 2014/0034883 A1* | 2/2014 | Seo | ............... | G02B 5/32 252/582 |
| 2014/0078583 A1* | 3/2014 | DeMeio | ............... | C09K 19/38 359/487.02 |
| 2014/0176880 A1* | 6/2014 | Cho | ............... | G02F 1/13363 349/96 |
| 2015/0015815 A1* | 1/2015 | Yamada | ............... | G02B 27/2214 349/15 |
| 2015/0099820 A1* | 4/2015 | Seo | ............... | C07C 251/24 522/39 |
| 2015/0112035 A1* | 4/2015 | Seo | ............... | C09K 19/20 526/204 |
| 2015/0129852 A1* | 5/2015 | Park | ............... | H01L 27/3262 257/40 |
| 2015/0177435 A1* | 6/2015 | Kim | ............... | G02B 27/26 349/194 |
| 2015/0191651 A1* | 7/2015 | Matsuyama | ............... | C08F 20/30 428/1.33 |
| 2015/0293286 A1* | 10/2015 | Jeon | ............... | G02B 5/3016 359/489.07 |
| 2015/0301385 A1* | 10/2015 | Tsunekawa | ......... | G02F 1/13363 349/12 |
| 2015/0322345 A1* | 11/2015 | Sargent | ............... | G02B 1/08 349/182 |
| 2015/0331279 A1* | 11/2015 | Kimura | ............... | G02B 5/201 349/42 |
| 2015/0378068 A1* | 12/2015 | Hatanaka | ............. | G02B 5/3016 349/184 |
| 2016/0060530 A1* | 3/2016 | Archetti | ............... | C09K 19/54 349/20 |
| 2016/0093833 A1* | 3/2016 | No | ............... | H01L 51/5293 257/40 |
| 2016/0108315 A1* | 4/2016 | Matsuyama | ....... | C09K 19/3491 428/421 |
| 2016/0154157 A1* | 6/2016 | Cho | ............... | G02B 1/11 359/489.07 |
| 2016/0195655 A1* | 7/2016 | Kagawa | ............... | G02B 5/3016 156/247 |
| 2016/0231486 A1* | 8/2016 | Lee | ............... | G02B 5/3041 |
| 2017/0088777 A1* | 3/2017 | Hasebe | ............... | C08F 220/30 |
| 2017/0292075 A1* | 10/2017 | Endo | ............... | C08F 2/44 |
| 2018/0059300 A1* | 3/2018 | Kim | ............... | G02B 1/14 |
| 2018/0067232 A1* | 3/2018 | Tan | ............... | G02F 1/13363 |
| 2018/0067348 A1* | 3/2018 | Hatanaka | ............... | G02F 1/1335 |
| 2018/0120487 A1* | 5/2018 | Ikeda | ............... | B05D 7/24 |
| 2018/0164633 A1* | 6/2018 | Kashima | ............... | G02F 1/1335 |
| 2018/0210253 A1* | 7/2018 | Kashima | ............... | G02F 1/1396 |
| 2018/0275329 A1* | 9/2018 | Ikeda | ............... | B32B 7/02 |
| 2019/0049791 A1* | 2/2019 | Yanai | ............... | G02F 1/133606 |

FOREIGN PATENT DOCUMENTS

| | | |
|---|---|---|
| CN | 105807359 A | 7/2016 |
| EP | 0 159 850 A2 | 10/1985 |
| JP | 2009-98578 A | 5/2009 |

OTHER PUBLICATIONS

English translation of International Search Report and Written Opinion for International Application No. PCT/CN2017/072484, dated Apr. 21, 2017, 17 pages.
First Office Action, including Search Report, for Chinese Patent Application No. 201610368428.0, dated Nov. 14, 2016, 6 pages.
Chinese Search Report for Chinese Patent Application No. 201610368428.0, dated Sep. 23, 2016, 10 pages.

(56) References Cited

OTHER PUBLICATIONS

Complete English translation of International Search Report for International Application No. PCT/CN2017/072484, dated Apr. 21, 2017, 5 pages.

* cited by examiner

LINEAR POLARIZING LAYER, CIRCULAR POLARIZING LAYER, FLEXIBLE DISPLAY APPARATUS, AND PREPARATION METHODS THEREOF

CROSS-REFERENCE TO RELATED APPLICATIONS

This application is a Section 371 National Stage Application of International Application No. PCT/CN2017/072484, filed on 24 Jan. 2017, which has not yet published, and claims priority to Chinese Application No. 201610368428.0, filed on 30 May 2016, incorporated herein by reference in their entirety.

FIELD OF THE INVENTION

This invention relates to the technical field of display, and further to a linear polarizing layer, a circular polarizing layer, a flexible display apparatus, and the preparation methods thereof.

BACKGROUND OF THE INVENTION

At present, the bendable display may be achieved by liquid crystal displays (LCDs) and organic light-emitting diode (OLED) display apparatuses. Among them, benefiting from the self-light emission, the bendable display with a smaller bending radius may be achieved more easily in OLED displays prepared on a flexible material. Therefore, the production of OLED display apparatuses comprising a flexible material has been widely focused on.

Due to the influence of flexible display screens which are light, thin, and easily bendable, a number of new demands for bendable terminal devices are generated. As for a top-emission organic light-emitting diode (OLED) display apparatus, a cathode material of an OLED light-emitting structure is deposited with the whole surface into a display region by vacuum deposition, and a magnesium silver alloy having a certain transmittance is selected as the cathode material. The cathode material itself is a metal and has a certain reflectivity, and in use, the ambient light is radiated onto the cathode to generate strong reflected light, which will affect the contrast of OLED display. Therefore, a circular polarizer is required to be attached to the outside of an OLED display panel when the evaporation of an organic light-emitting material is completed so as to eliminate the external reflected light and increase the contrast of an OLED device.

In order to enable a flexible display screen to have a better bendability and to achieve more forms of bending morphologies, respective film layers in the flexible display screen are thinned or mechanical properties of respective functional film materials are adjusted, which contributes to the bendability of the flexible display screen. A conventional circular polarizer is typically composed of a linear polarizer and a quarter-wave phase retardation sheet. At present, a commercial linear polarizer is mainly composed of a layer of polyvinyl alcohol, two layers of TAC, and a pressure-sensitive adhesive, and has a thickness typically between 150 um-250 um. Although the mechanical strength thereof is good, the thickness thereof is relatively large and the bending property thereof is insufficient.

SUMMARY OF THE INVENTION

According to an aspect of this invention, there is provided a preparation method of a linear polarizing layer, comprising the steps of:

coating a polarizing film precursor material on a flexible base material, wherein the polarizing film precursor material comprises a polarizing material capable of being oriented under a field effect;

orientating the polarizing film precursor material by field induction to allow the direction of orientation of the polarizing film precursor material to be vertical to the direction of a bending axis of the flexible base material; and curing the polarizing film precursor material to form a linear polarizing layer on the flexible base material.

Preferably, the polarizing material comprises a dichroic dye, a dispersion solvent, and a polymerizable active monomer.

Preferably, the polymerizable active monomer is oriented and polymerized under field induction to form a polymer chain compound after polymerization, and the direction of the polymer chain segments of the polymer chain compound is vertical to the direction of the bending axis of the flexible base material, so that the dichroic dye included among the polymer chain compound is oriented in the direction vertical to the bending axis of the flexible base material.

Preferably, the polymerizable active monomer is a vinyl ether cationic monomer.

Preferably, the manner of field induction comprises:

electric field induction, wherein an electric field having a direction vertical to the direction of the bending axis of the flexible base material is applied at the area of the linear polarizing layer; or magnetic field induction, wherein a magnetic field having a direction vertical to the direction of the bending axis of the flexible base material is applied at the area of the linear polarizing layer; or light orientation field induction, wherein a light orientation field having a direction vertical to the direction of the bending axis of the flexible base material is applied at the area of the linear polarizing layer.

Preferably, the dichroic dye comprises anthraquinone dyes or azo dyes.

Preferably, the dichroic dye comprises anthraquinone dyes or azo dyes having a light-absorbing group on in the long axis direction of the dye molecule.

Preferably, the dispersion solvent comprises a small-molecule nematic liquid crystal for dispersing the dichroic dye.

Preferably, the content of the dichroic dye is between 0.2% and 20%, the content of the dispersion solvent is between 50% and 80%, and the content of the polymerizable active monomer is between 0.05% and 5%, based on the total weight of the polarizing film precursor material.

According to another aspect of this invention, there is provided a linear polarizing layer, which is prepared by using the preparation method of a linear polarizing layer of any one above.

Preferably, the linear polarizing layer has a thickness between 5 μm and 40 μm.

According to another aspect of this invention, there is provided a preparation method of a circular polarizing layer, comprising the steps of:

preparing a phase retardation film on a flexible substrate; and preparing a linear polarizing layer, which is prepared by using the preparation method of a linear polarizing layer of any one above, on the flexible substrate, to form a circular polarizing layer comprising a phase retardation film and a linear polarizing layer.

Preferably, said preparing a phase retardation film on a flexible substrate comprises the steps of:

coating a phase retardation material on a flexible substrate, wherein the phase retardation material comprises a polarizing material capable of being oriented under the field effect;

orientating the phase retardation material by field induction to allow the direction of orientation of the phase retardation material to be vertical to the direction of a bending axis of the flexible substrate; and curing the oriented phase retardation material to form a phase retardation film on the flexible substrate.

Preferably, the manner of field induction, which makes the phase retardation material oriented, is:

electric field induction, wherein an electric field having a direction vertical to the direction of the bending axis of the flexible substrate is applied at the area of the phase retardation film; or magnetic field induction, wherein a magnetic field having a direction vertical to the direction of the bending axis of the flexible substrate is applied at the area of the phase retardation film; or light orientation field induction, wherein a light orientation field having a direction vertical to the direction of the bending axis of the flexible substrate is applied at the area of the phase retardation film.

Preferably, said curing the oriented phase retardation material comprises the step of curing the oriented phase retardation material in a manner of photocuring or thermocuring.

According to still another aspect of this invention, there is provided a circular polarizing layer, which is prepared by using the preparation method of a circular polarizing layer of any one above.

Preferably, the circular polarizing layer has a thickness between 10 μm and 60 μm.

According to still another aspect of this invention, there is provided a preparation method of a flexible display apparatus, comprising the steps of:

forming an organic light-emitting layer on a flexible material and performing thin-film encapsulation to form a flexible substrate; and forming a circular polarizing layer on the flexible substrate according to the preparation method of a circular polarizing layer of any one above.

According to still another aspect of this invention, there is provided a flexible display apparatus, which is prepared by using the preparation method of a flexible display apparatus described above.

DETAILED DESCRIPTION OF THE INVENTION

Figure 1:
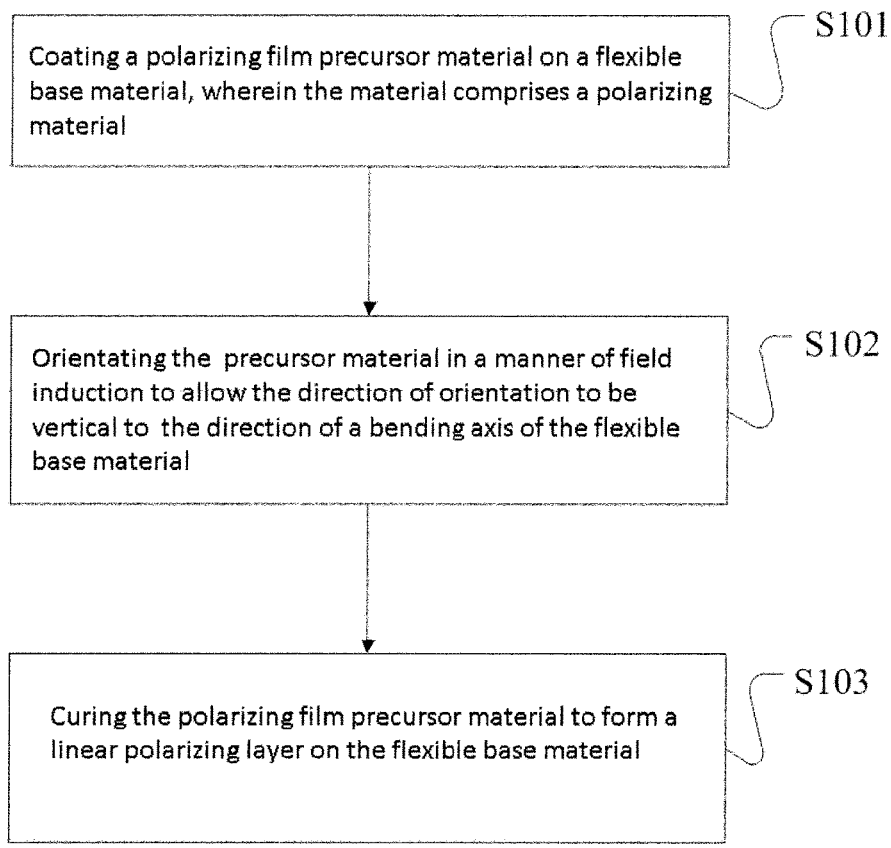
FIG. 1 is a flow chart of the preparation method of the linear polarizing layer in Example 1 of this invention.

According to Examples of this invention, in the preparation of a linear polarizing layer, the direction of orientation of the polarizing film precursor material is allowed to be vertical to the direction of a bending axis of the flexible base material, so that the thickness of the linear polarizing layer is reduced to improve the bending resistance thereof on the basis of the achievement of anti-reflection.

In order to enable the objects, technical solutions, and advantages of this invention to be more obvious and clear, this invention will be further illustrated in detail in conjunction with the specific embodiments and with reference to the accompanying drawings. The description of the embodiments of this invention with reference to figures is intended to explain the general inventive concept of this invention and should not be construed as limitation on this invention. It is to be noted that the same element is denoted by the same or similar reference numeral throughout the accompanying drawings. In the description below, some particular Examples are for the purpose of description only, and should not be construed as any limit to this invention but instances of Examples of this invention. When confusion of the understanding of this invention may be caused, the conventional structures or configurations will be omitted. It is to be noted that the shapes and sizes of respective members in the drawings do not reflect the real sizes and ratios, but exemplify the contents of Examples of this invention only.

EXAMPLE 1

This example provides a preparation method of a linear polarizing layer. With reference to FIG. 1, the preparation method of a linear polarizing layer of this example may comprise the steps of:

step S101: coating a polarizing film precursor material on a flexible base material, wherein the polarizing film precursor material comprises a polarizing material capable of being oriented under a field effect;

step S102: orientating the polarizing film precursor material by field induction to allow the direction of orientation of the polarizing film precursor material to be vertical to the direction of a bending axis of the flexible base material; and step S103: curing the polarizing film precursor material to form a linear polarizing layer on the flexible base material.

Figure 2:
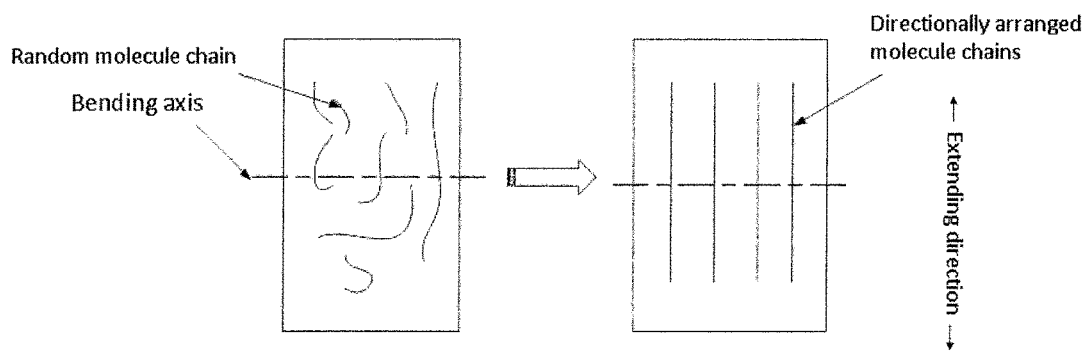
FIG. 2 is a schematic diagram in which the linear polarizing layer is oriented in the direction vertical to the direction of the bending axis of the flexible base material in Example 1 of this invention.

The preparation method of the linear polarizing layer of Example 1 will be described in detail below in conjunction with FIGS. 2 and 3. In step S101, the flexible base material may be an integrated material structure, and is formed by depositing an organic light-emitting material on a flexible material, performing thin-film encapsulation, and covering with a phase retardation film. This flexible base material may be bent along the bending axis thereof so as to achieve bendable display of a display device with a smaller bending radius.

Here, a common method for coating a liquid mixture on a surface may be used as the manner of coating, and preferably brush coating and/or spin coating may be used.

In this Example, the polarizing film precursor material is a liquid mixture, which may be oriented by field induction and may also be cured under the action of an external field. The polarizing film precursor material comprises a polarizing material capable of achieving the effects of polarization and orientation, and the polarizing material may comprise a dichroic dye, a dispersion solvent, and a polymerizable active monomer.

Here, the dichroic dye is a core material having the function of polarization, and the common dichroic dyes are as shown below:
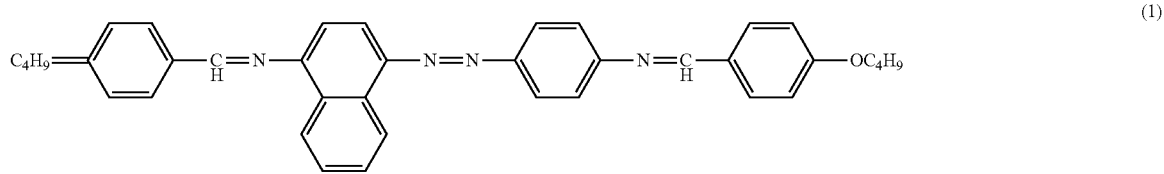
(1)
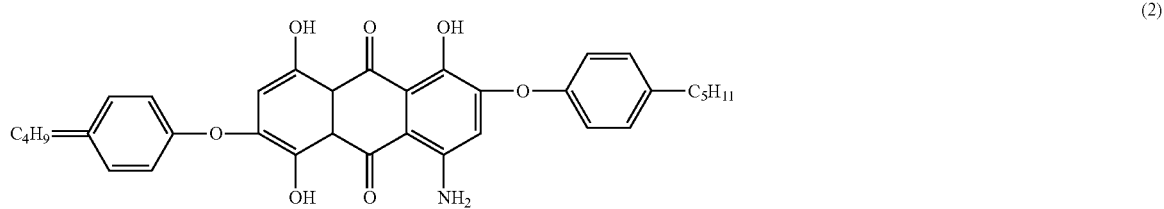
(2)
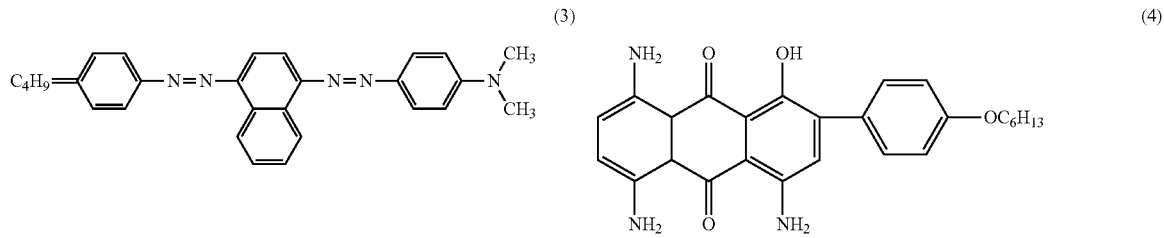
(3)
(4)
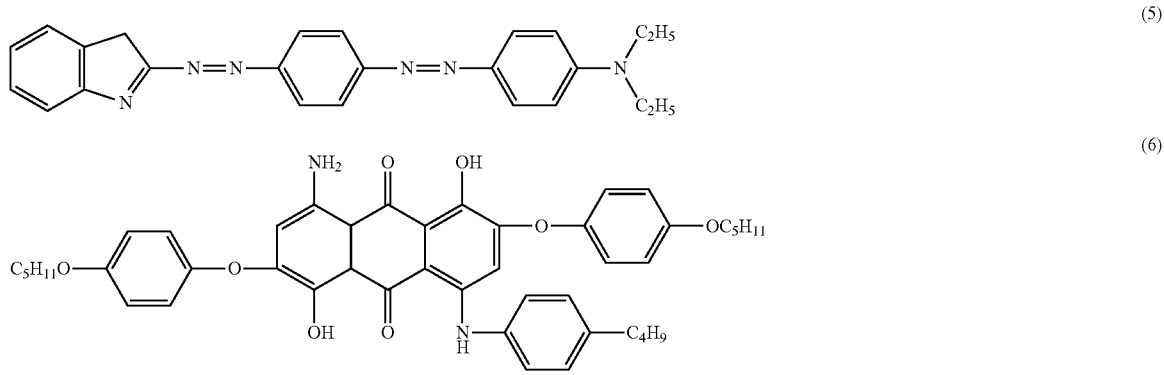
(5)
(6)
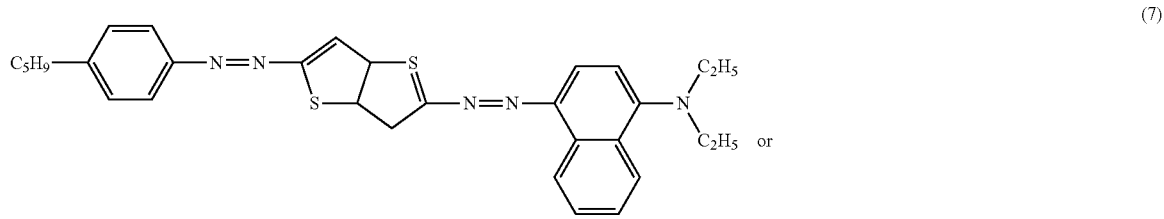
(7)
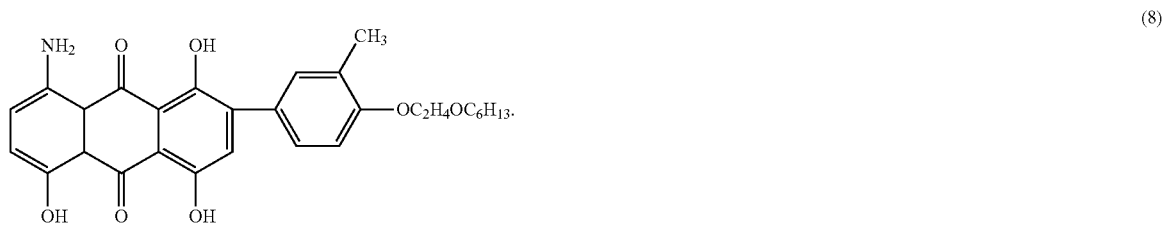
(8)

Preferably, the dichroic dye may comprise anthraquinone dyes or azo dyes. Further preferably, the light-absorbing groups of the anthraquinone dyes or azo dyes are in the long axis directions of the molecules, for example:

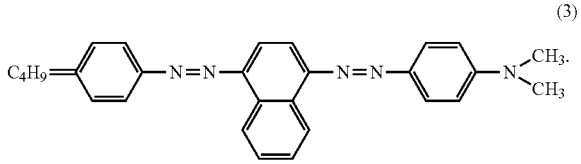

(3)

The dichroic ratio (DR) of the dichroic dye is in positive correlation with the degree of polarization (DoP) of the linear polarizing layer, and the greater the dichroic ratio (DR) is, the higher the degree of polarization (DoP) is, wherein the dichroic ratio (DR) satisfies the relationship as follows:

$$DR=A_\parallel/A_\perp;$$

wherein DR is the dichroic ratio of the dichroic dye, $A_\parallel$ is the absorbance parallel to the long axis direction of the dichroic dye molecule, and $A_\perp$ is the absorbance vertical to the long axis direction of the dichroic dye molecule. Therefore, a relatively high value of the dichroic ratio should be maintained so as to improve the degree of order of the dye molecule.

In this Example, the content of the dichroic dye may be between 0 and 45%, preferably between 0.2% and 20%, and further preferably between 5% and 10%, based on the total weight of the polarizing film precursor material.

The dispersion solvent comprised in the polarizing material of the polarizing film is mainly used as a carrier for the dichroic dye. Preferably, the dispersion solvent may be a small-molecule nematic liquid crystal, for example LC242 available from BASF Corporation, US. Here, the small molecule is relative to the polymer formed after the polymerization of the polymerizable active monomer, and that is, this small-molecule nematic liquid crystal is a nematic liquid crystal which is not subjected to polymerization reaction. Further preferably, there is a good intersolubility between the small-molecule nematic liquid crystal and the dichroic dye to contribute to uniform dispersion of the dichroic dye. In addition, the small-molecule nematic liquid crystal also has the function of polarization. The content of the dispersion solvent is between 10% and 85%, preferably between 30% and 83%, and further preferably between 50% and 80%, based on the total weight of the polarizing film precursor material.

The polarizing material of the polarizing film further comprises a polymerizable active monomer. The polymerizable active monomer has the effect of being capable of performing orientation and polymerization under a field effect to form a polymer chain after polymerization, and the orientation of the dichroic dye can be maintained to allow the dichroic dye molecule to be maintained at a relatively high degree of order. The polymerizable active monomer may be preferably a polymerizable liquid crystal, for example RM257 available from Merck Corporation, US, or preferably a vinyl ether cationic monomer, for example RM257, which belongs to a UV reaction type liquid crystal, and the mixture comprising this material has a relatively low cost and is readily available. The UV reaction type liquid crystal exhibits a crystalline state at normal temperature. However, when it is placed in a solvent, it is dissolved to be liquid state, and the liquid crystal molecules are uniformly distributed in this solvent. Here, any one or a combination of cyclopentanone, acetone, propylene glycol methyl ether acetate, toluene, and chloroform may be selected as the solvent. Thus, the polarizing film precursor material exhibits a liquid state as a whole, which may be conveniently used in the subsequent procedures of coating and orientation. The UV reaction type liquid crystal described above is subjected to polymerization to generate a polymer chain compound, and can be extended and oriented in the direction of a magnetic field under the action of a magnetic field. Whereas, the dichroic dye is included among the polymer chain compound of the UV reaction type liquid crystal, and in the process of the orientation of the UV reaction type liquid crystal, the orientation of the dichroic dye is also achieved. The content of the polymerizable active monomer is preferably between 0 and 10%, and more preferably between 0.05 and 5%, based on the total weight of the polarizing film precursor material. In addition to magnetic field induction, the polymer chain compound of the UV reaction type liquid crystal may also be oriented under the action of an electric field and light.

In this Example, the polarizing film precursor material further comprises an initiator. The initiator can initiate the polymerization of the polymerizable active monomer. If the initiator is a photoinitiator, correspondingly, the manner of subsequently curing the polarizing film precursor material is curing with ultraviolet light; or if the initiator is a thermo-curing initiator, correspondingly, the manner of subsequently curing the polarizing film precursor material is heating. The content of the initiator is preferably between 0 and 7%, and more preferably between 0.5% and 3%, based on the total weight of the polarizing film precursor material.

In step S102, the polarizing film precursor material is oriented by field induction to allow the direction of orientation thereof to be vertical to the direction of a bending axis of the flexible base material. FIG. 2 shows a schematic diagram in which the linear polarizing layer according to an Example of this invention is oriented vertically to the direction of the bending axis of the flexible base material. As shown in FIG. 2, Without applying field induction, the random molecule chains formed are arbitrarily arranged in the linear polarizing layer. After field induction is applied, the directionally arranged molecule chains are formed, and the direction thereof is vertical to the direction of the bending axis of the flexible base material, and correspondingly, the extending direction of the molecule chains is also vertical to the direction of the bending axis.

Here, the field induction is: electric field induction, wherein an electric field having a direction vertical to the direction of the bending axis of the flexible base material is applied at the area of the linear polarizing layer; or, magnetic field induction, wherein a magnetic field having a direction vertical to the direction of the bending axis of the flexible base material is applied at the area of the linear polarizing layer; or, light orientation field induction, wherein a light orientation field having a direction vertical to the direction of the bending axis of the flexible base material is applied at the area of the linear polarizing layer.

Preferably, the induction is performed in a manner of electric field, and a polymerizable active monomer (for example, RM257) is polymerized and oriented by the induction under an electric field to form a polymer chain compound after polymerization. Upon induction, the anode and the cathode of an electric field are symmetrically placed, and electricity is applied to form an electric field having a direction vertical to the bending axis. According to the Flory theory in polymer physics, the most stable structure of an amorphous polymer chain segment is a microscopic random chain segment. According to the principle of entropy increase, the polymer chain segment has the trend back to the random state after the polymer is oriented. Thus, the vertically oriented polymer chain segment will shrink in all directions to facilitate the regression to the chaotic state. The orientation in the vertical direction is the most regular, then the regression preferably begins in this direction. Therefore, it is shown macroscopically that a force is first applied to the linear polarizing layer in the direction vertical to the bending axis, and the linear polarizing layer will not be drawn in the plane of the layer, which will not result in break-down and failure of the linear polarizing layer.

Figure 3:
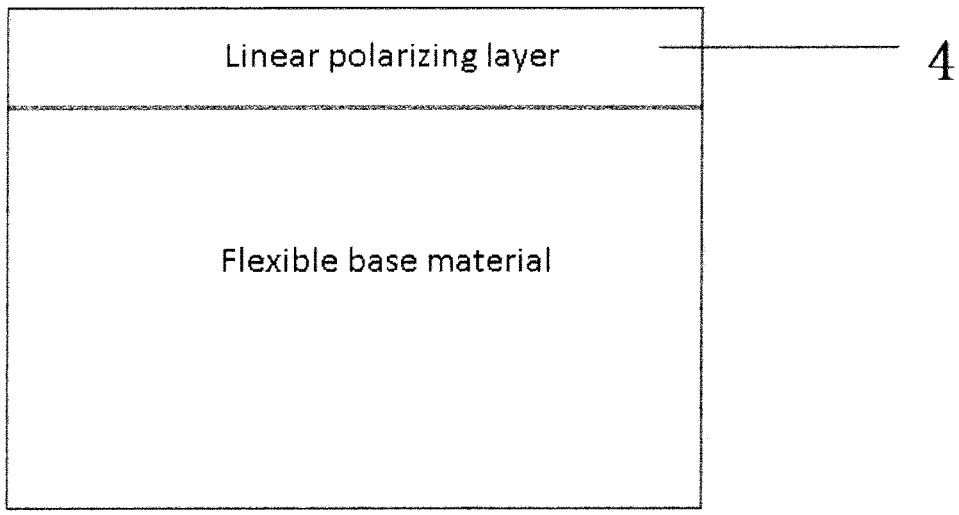
FIG. 3 is a schematic diagram of the linear polarizing layer prepared by the preparation method in Example 1 of this invention.

FIG. 3 shows a schematic diagram of the linear polarizing layer prepared by the preparation method according to this Example. The linear polarizing layer 4 may be formed in a manner of photocuring (for example, UV ultraviolet light). Accordingly, the initiator is a photoinitiator, and trimethylbenzoyldiphenylphosphine oxide or ethyl trimethylbenzoylphenylphosphonate may be used as the photoinitiator. Therefore, a mixture may be irradiated with UV light emitted from a UV light source to allow the mixture to be cured by the photoinitiator to form a linear polarizing layer 4.

The photoinitiator described above is subjected to polymerization reaction in the case of light (for example, UV) irradiation to generate a cross-linked and cured compound, so as to allow the mixture to be cured, and that is, a linear polarizing layer having specific orientation (corresponding orientation which has been already analyzed in detail) is prepared.

Furthermore, the polarizing layer may also be formed in a manner of thermocuring in this Example. At the meanwhile, in order to ensure the efficiency of thermocuring, a heat insulating agent may not be added to the mixture from which the polarizing layer is formed. Accordingly, the initiator is a thermal initiator; and the process of curing the polarizing film precursor material to form a linear polarizing layer comprises the step of allowing the mixture to be cured by the thermal initiator in a manner of thermocuring to form a linear polarizing layer, wherein the temperature of the thermocuring is in a range of 80° C.-400° C. A cross-linked and cured compound is also generated by the thermal initiator described above in the case of heating, so as to allow the mixture to be cured.

The thickness of the linear polarizing layer 4 prepared on the flexible base material is between 3 μm and 50 μm, and further preferably between 5 μm and 40 μm. Compared to a conventional polarizing layer, the thickness of the polarizer layer is reduced and the bending strength can be improved, and at the meanwhile, the original mechanical strength and polarization effect can also be ensured.

In the conventional process of preparing a linear polarizer or a linear polarizing layer, it is required to firstly form an orientation layer (formed from polyimide) and then obtain the orientation in a manner of rubbing so as to obtain elongated grooves in the same direction on the upper surface of the material. Although these process steps can provide orientation to the subsequent polarizing layer, the complexity of the process is increased and the total thickness of the display apparatus is also increased. According to this Example, since the linear polarizing layer has been completely oriented (vertical to the direction of the bending axis of the flexible base material) under the field effect, it is not required to preliminarily form an orientation layer when a linear polarizing layer is prepared. This reduces complexity of the process flow, the total thickness of the linear polarizing layer may be reduced, and the bending effect is improved.

EXAMPLE 2

Figure 4:
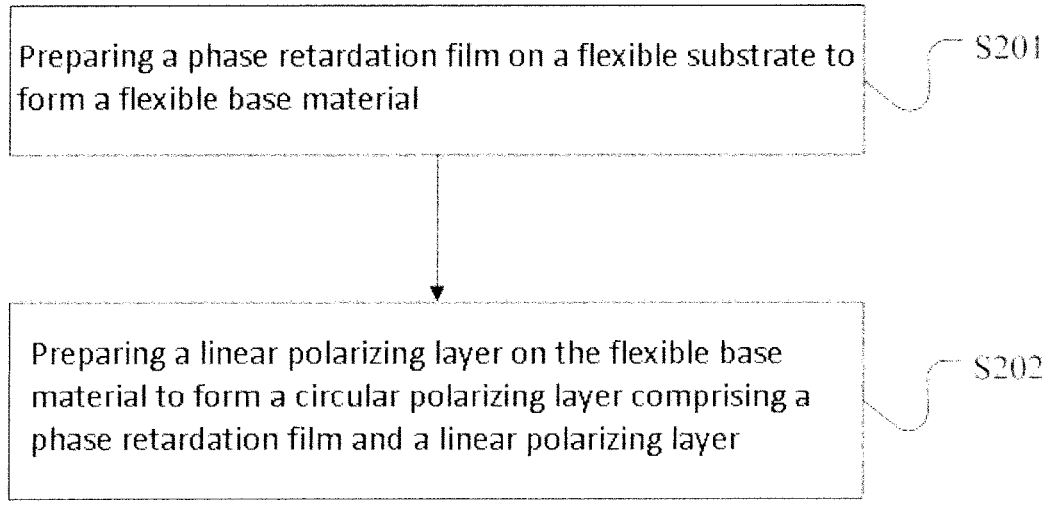
FIG. 4 is a flow chart of the preparation method of the circular polarizing layer in Example 2 of this invention.

According to another Example of this invention, there is further provided a preparation method of a circular polarizing layer. As shown in FIG. 4, the preparation method of a linear polarizing layer according to this Example 2 may comprise the steps of:

step S201: preparing a phase retardation film 3 on a flexible substrate to form a flexible base material; and step S202: preparing a linear polarizing layer 4 on the flexible base material to form a circular polarizing layer comprising a phase retardation film 3 and a linear polarizing layer 4, wherein the linear polarizing layer 4 is prepared by using the preparation method of Example 1 described above.

When the display screen prepared from the flexible base material described above is bent, the display screen is drawn in the direction vertical to the bending axis. When the display screen is bent repeatedly, the material is drawn and shrinks repeatedly, which will easily cause the attenuation of service life. If the direction of orientation of the circular polarizing layer is allowed to be vertical to the direction of the bending axis, the direction of shrinkage of the molecule chains themselves is consistent with the direction in which a force is applied, which will contribute to the increase of the service life of the display screen.

The flexible substrate may be an integrated material structure, and is formed by depositing an organic light-emitting material on a flexible material and then performing thin-film encapsulation. This flexible substrate may be bent along the bending axis, and may be used as a display device to achieve bendable display with a smaller bending radius.

The preparation process of the phase retardation film 3 may comprise the steps of: coating a phase retardation material onto a flexible substrate by a method of coating, orientating the phase retardation material in a manner of field induction to allow the direction of orientation thereof to be vertical to the direction of a bending axis of the flexible substrate, and performing curing by a method of photocuring or thermocuring.

Preferably, the phase retardation film 3 is a quarter-wave phase retardation film.

The field induction, which makes the phase retardation material oriented, is: electric field induction, wherein an electric field having a direction vertical to the direction of the bending axis of the flexible substrate is applied at the area of the phase retardation film; or, magnetic field induction, wherein a magnetic field having a direction vertical to the direction of the bending axis of the flexible substrate is applied at the area of the phase retardation film; or, light orientation field induction, wherein an light orientation field having a direction vertical to the direction of the bending axis of the flexible substrate is applied at the area of the phase retardation film.

Preferably, the phase retardation material may comprise a dispersion solvent, a polymerizable active monomer, a dichroic dye, and an initiator. The particular selection of the respective components described above is similar to that of the respective components in the polarizing film precursor material. Detailed introductions can be seen in the related parts in Example 1, and verbose words are omitted herein.

However, it is to be indicated that as for the polymerizable active monomer, it may be polymerized and oriented under field induction to form a polymer chain compound after polymerization, and the polymer chain segments thereof are orientated in the direction vertical to the bending axis of the flexible substrate. Therefore, macroscopically, a force is firstly applied to the phase retardation film in the direction vertical to the bending axis, and the linear polarizing layer will not be drawn in the plane of the layer, which will not result in break-down and failure of the phase retardation film. As for the dichroic dye, its orientation is affected by the polymer chain compound after polymerization, and is consistent with the orientation of the polymer chain segments and has a high orderliness, so that light reflection can be prevented after polarized light is passed through the phase retardation film twice.

Figure 5:
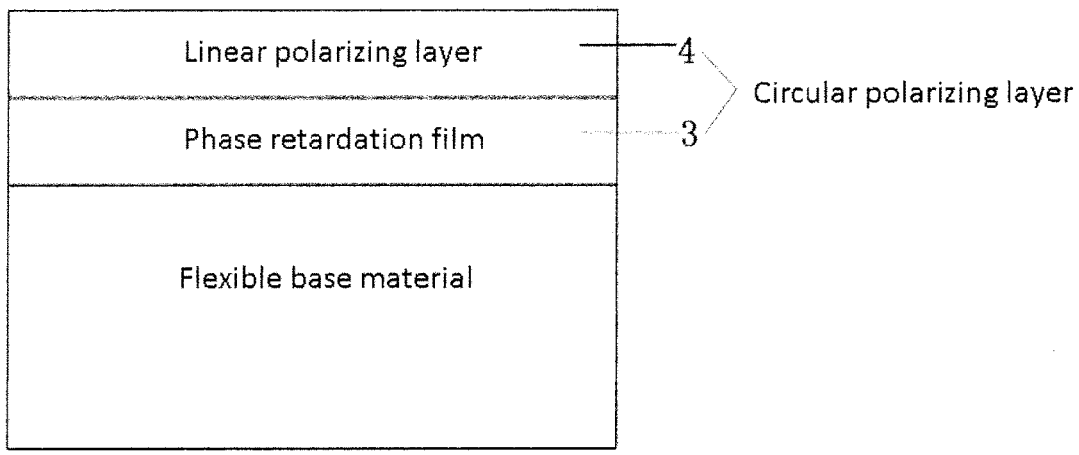
FIG. 5 is a schematic diagram of the circular polarizing layer prepared by the preparation method in Example 2 of this invention.

FIG. 5 shows a schematic diagram of the circular polarizing layer prepared by the preparation method according to Example 2 of this invention. With reference to FIG. 5, the thickness of the circular polarizing layer, prepared by the preparation method of a circular polarizing layer according to Example 2 of this invention, is 4-80 μm, and preferably 10-60 μm, and has been greatly improved compared to conventional circular polarizers. A conventional circular polarizer is typically composed of a linear polarizer and a quarter-wave phase retardation sheet. A commercial linear polarizer is mainly composed of a layer of polyvinyl alcohol, two layers of TAC (cellulose triacetate), and a pressure-sensitive adhesive, and has a thickness of typically 150-200 μm. A COP (cycloolefin polymer) is typically used as the quarter-wave phase retardation sheet and also has a relatively large thickness. Therefore, by reducing the thickness of a circular polarizing layer, the bending resistance of the corresponding circular polarizer can be improved.

Figure 6:
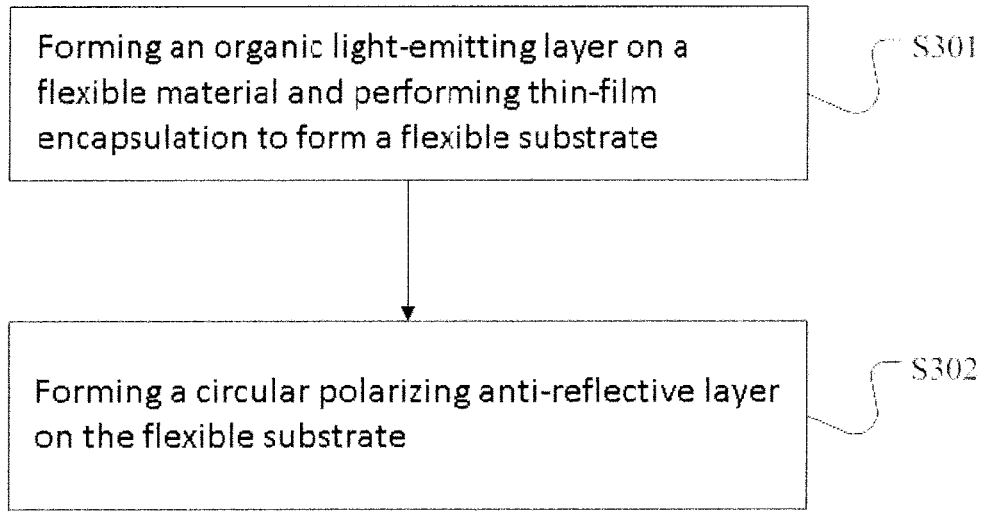
FIG. 6 is a flow chart of the preparation method of the flexible display apparatus in an Example of this invention.
Figure 7:
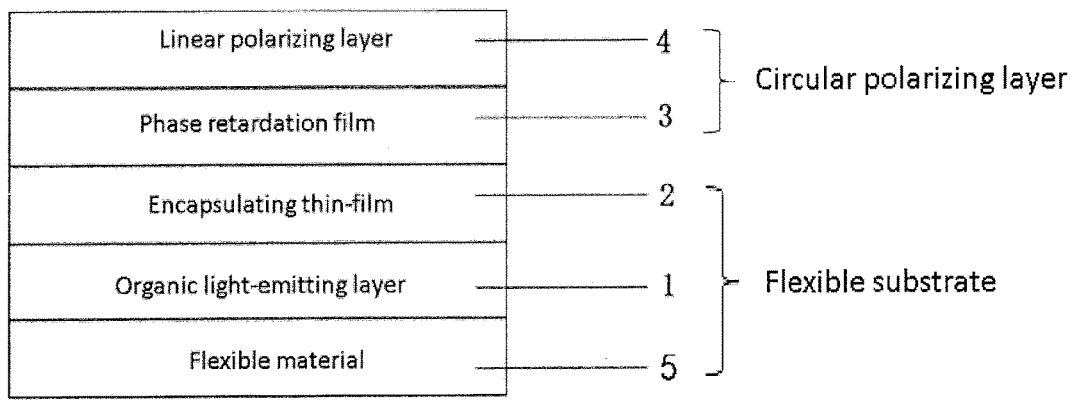
FIG. 7 is a schematic diagram of the flexible display apparatus in an Example of this invention.

According to an Example of this invention, there is further provided a preparation method of a flexible display apparatus. FIG. 6 shows a flow chart of the preparation method of the flexible display apparatus according to an Example of this invention. FIG. 7 shows a schematic diagram of the flexible display apparatus obtained by using the preparation method of FIG. 6. The preparation method of a flexible display apparatus according to an Example of this invention will be described in detail below with reference to FIGS. 6 and 7.

As shown in FIGS. 6 and 7, a preparation method of a flexible display apparatus may comprise the steps of:

step S301: forming an organic light-emitting layer 1 on a flexible material and performing thin-film encapsulation to form an encapsulating thin-film 2, thereby forming a flexible substrate; and step S302: forming a circular polarizing layer on the flexible substrate by using the preparation method of a circular polarizing layer of Example 2.

The select of the flexible material may be a common material conventionally used in the production of a flexible display screen, and is not limited herein.

In this Example, the flexible display apparatus is preferably a LED liquid crystal display (LCD) and an organic light-emitting diode (OLED) display apparatus which achieve bendable display.

Figure 8:
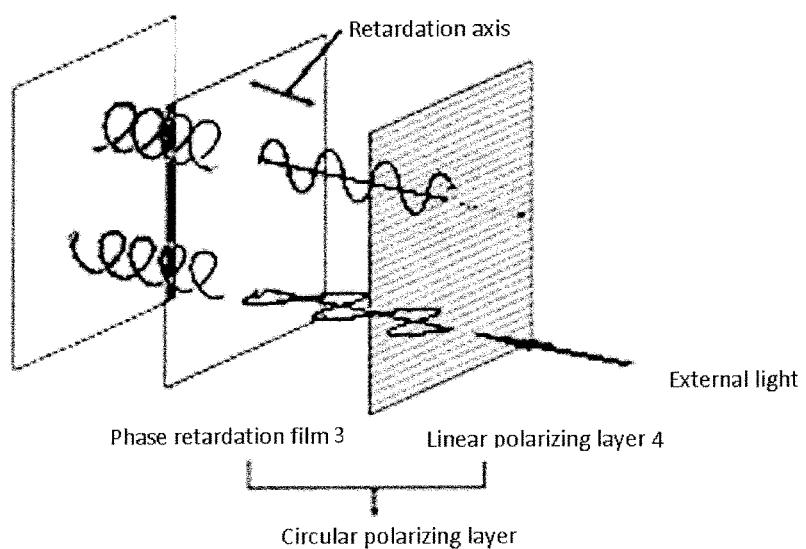
FIG. 8 is a principle diagram of the reflection of the flexible display apparatus in an Example of this invention.

The circular polarizing layer formed in step 302 may be used in anti-reflection. FIG. 8 shows a schematic diagram of the effect of anti-reflection of a flexible display apparatus. As shown in FIG. 8, the circular polarizing layer of the flexible display apparatus comprises a linear polarizing layer 4 and a phase retardation film 3 according to an Example of this invention so as to eliminate reflection of external light. When the external light enters the flexible display apparatus, it is firstly passed through the linear polarizing layer 4 to form a polarized light, and the polarized light is passed through the phase retardation film 3 having a retardation axis vertical to the plane thereof to form a left-rotating/right-rotating light and is then reflected by the organic light-emitting layer to become a right-rotating/left-rotating light, which is thus rotated by 90° in the direction of the optical axis of the phase retardation film 3 so as to fail to be passed through the linear polarizing layer 4, thereby achieving the effect of anti-reflection.

According to an Example of this invention, there is further provided a linear polarizing layer, wherein the linear polarizing layer is prepared by using the method of Example 1 described above.

The polymer material synthesized in the linear polarizing layer is vertical to the direction of the bending axis of the flexible base material to reduce internal stress, which has been already introduced hereinbefore, and verbose words are omitted herein. Also, the dichroic dye in the interior having the function of polarization is maintained in the direction vertical to the direction of the bending axis of the flexible base material by the fixation effect of the polymer material, and its high degree of order provides an effect of high polarization. Furthermore, the total thickness of the linear polarizing layer has been greatly improved (thinner) compared to the prior art, which enhances the flexibility of the linear polarizing layer.

According to an Example of this invention, there is further provided a circular polarizing layer, wherein the circular polarizing layer is prepared by using the method of Example 2 described above.

Here, the circular polarizing layer prepared is as shown with reference to FIG. 5, and the total thickness of the circular polarizing layer is smaller compared to conventional circular polarizing layers and the mechanical and optical properties in other aspects can be still maintained, which has been already introduced hereinbefore, and verbose words are omitted herein.

According to another Example of this invention, there is further provided a flexible display apparatus, wherein the flexible display apparatus is prepared by using the method shown in FIG. 6.

With reference to FIG. 7, the flexible display apparatus prepared may sequentially comprise a flexible material, an organic light-emitting layer 1, an encapsulating thin-film 2, a phase retardation film 3, and a linear polarizing layer 4. Since respective layers on the flexible material are all prepared by the coating techniques (for example, the organic light-emitting layer 1 is prepared in a manner of evaporation and the encapsulating thin-film 2, the phase retardation film 3, and the linear polarizing layer 4 are all prepared in a manner of brush coating), the thicknesses of respective layers may be controlled in a relatively small range and the thickness of the film layer is reduced as a whole, and therefore the bending resistance of the flexible display apparatus is improved and at the meanwhile the yield rate of the product is improved. Therefore, the flexible display apparatus may be flexibly bent along the bending axis.

Figure 9:
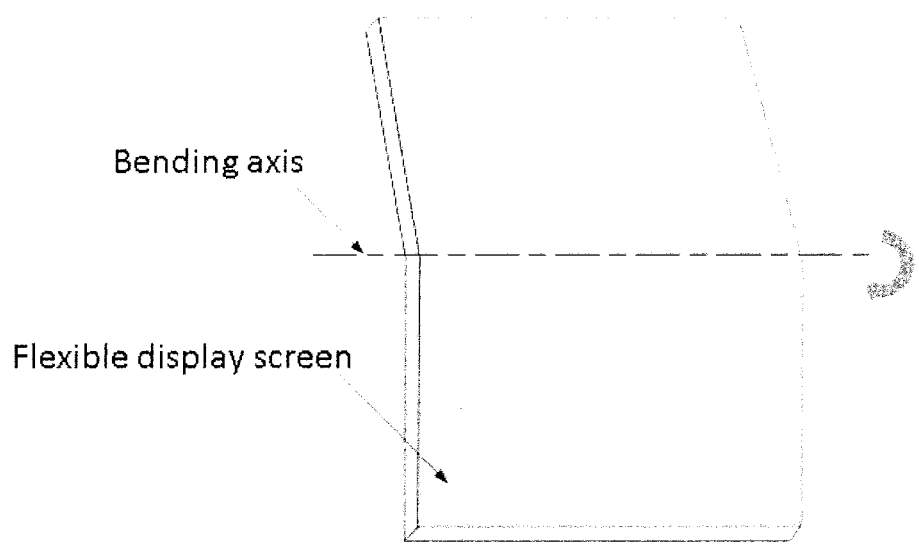
FIG. 9 is a schematic diagram in which a flexible display screen is bent.

Here, the flexible display apparatus is a bendable liquid crystal display (LCD) and a bendable organic light-emitting diode (OLED) flexible display apparatus, preferably a flexible organic light-emitting diode display apparatus, as shown in FIG. 9.

It is to be indicated that definitions of respective elements described above are not only limited to various particular structures or shapes mentioned in embodiments and simple and well-known replacements may be made by those of ordinary skill in the art. The objects, technical solutions, and advantageous effects of this invention are further illustrated in detail by the specific Example described above. It is to be understood that those described above are merely specific Examples of this invention, but are not intended to limit this invention. All of the modifications, equivalent replacements, improvements, and the like, which are within the spirit and the principle of this invention, should be encompassed in the scope protected by this invention.

What is claimed is:

1. A preparation method of a linear polarizing layer, comprising the steps of:
    coating a polarizing film precursor material on a first flexible base material, wherein the polarizing film precursor material comprises a polarizing material capable of being oriented under a field effect;
    orientating the polarizing film precursor material by field induction to allow a direction of orientation of the polarizing film precursor material to be vertical to a direction of a bending axis of the first flexible base material when the first flexible base material is bent; and
    curing the oriented polarizing film precursor material to form a linear polarizing layer on the first flexible base material.

2. The preparation method of a linear polarizing layer according to claim 1, wherein the polarizing material comprises a dichroic dye, a dispersion solvent, and a polymerizable active monomer.

3. The preparation method of a linear polarizing layer according to claim 2, wherein the polymerizable active monomer is oriented and polymerized under field induction to form a polymer chain compound after polymerization, and the direction of the polymer chain segments of the polymer chain compound is vertical to the direction of the bending axis of the first flexible base material, so that the dichroic dye included among the polymer chain compound is oriented in the direction vertical to the bending axis of the first flexible base material.

4. The preparation method of a linear polarizing layer according to claim 2, wherein the polymerizable active monomer is a vinyl ether cationic monomer.

5. The preparation method of a linear polarizing layer according to claim 2, wherein the field induction comprises:
    electric field induction, wherein an electric field having a direction vertical to the direction of the bending axis of the first flexible base material is applied at the area of the linear polarizing layer; or
    magnetic field induction, wherein a magnetic field having a direction vertical to the direction of the bending axis of the first flexible base material is applied at the area of the linear polarizing layer; or
    light orientation field induction, wherein a light orientation field having a direction vertical to the direction of the bending axis of the first flexible base material is applied at the area of the linear polarizing layer.

6. The preparation method of a linear polarizing layer according to claim 2, wherein the dichroic dye comprises anthraquinone dyes or azo dyes.

7. The preparation method of a linear polarizing layer according to claim 6, wherein the dichroic dye comprises anthraquinone dyes or azo dyes having a light-absorbing group in a long axis direction of a dye molecule in the anthraquinone dyes or the azo dyes.

8. The preparation method of a linear polarizing layer according to claim 2, wherein the dispersion solvent comprises a small-molecule nematic liquid crystal for dispersing the dichroic dye.

9. The preparation method of a linear polarizing layer according to claim 2, wherein the content of the dichroic dye is between 0.2% and 20%, the content of the dispersion solvent is between 50% and 80%, and the content of the polymerizable active monomer is between 0.05% and 5%, based on the total weight of the polarizing film precursor material.

10. A linear polarizing layer, which is prepared by the preparation method according to claim 1.

11. The linear polarizing layer according to claim 10, wherein the linear polarizing layer has a thickness between 5 μm and 40 μm.

12. A preparation method of a circular polarizing layer, comprising the steps of:
    preparing a phase retardation film on a flexible substrate to form a second flexible base material; and
    preparing a linear polarizing layer on the second flexible base material according the preparation method of claim 1 to form a circular polarizing layer comprising a phase retardation film and a linear polarizing layer.

13. The preparation method of a circular polarizing layer according to claim 12, wherein said preparing a phase retardation film on a flexible substrate comprises the steps of:
    coating a phase retardation material on a flexible substrate, wherein the phase retardation material comprises a polarizing material capable of being oriented under a field effect;
    orientating the phase retardation material by field induction to allow the direction of orientation of the phase retardation material to be vertical to the direction of a bending axis of the flexible substrate; and
    curing the oriented phase retardation material to form a phase retardation film on the flexible substrate.

14. The preparation method of a circular polarizing layer according to claim 13, wherein the manner of field induction, which makes the phase retardation material oriented, is:
    electric field induction, wherein an electric field having a direction vertical to the direction of the bending axis of the flexible substrate is applied at the area of the phase retardation film; or
    magnetic field induction, wherein a magnetic field having a direction vertical to the direction of the bending axis of the flexible substrate is applied at the area of the phase retardation film; or
    light orientation field induction, wherein a light orientation field having a direction vertical to the direction of the bending axis of the flexible substrate is applied at the area of the phase retardation film.

15. The preparation method of a circular polarizing layer according to claim 13, wherein said curing the oriented phase retardation material comprises the step of curing the oriented phase retardation material in a manner of photocuring or thermocuring.

16. A circular polarizing layer, which is prepared by the preparation method according to claim 12.

17. The circular polarizing layer according to claim 16, wherein the circular polarizing layer has a thickness between 10 μm and 60 μm.

18. A preparation method of a flexible display apparatus, comprising the steps of:
    forming an organic light-emitting layer on a flexible material and performing thin-film encapsulation to form a flexible substrate; and
    preparing a circular polarizing layer on the flexible substrate according to the preparation method of claim 12.

19. A flexible display apparatus, which is prepared by the preparation method according to claim 18.

20. The linear polarizing layer according to claim 10, wherein the field induction includes:
- electric field induction, wherein an electric field having a direction vertical to the direction of the bending axis of the first flexible base material is applied at the area of the linear polarizing layer; or
- magnetic field induction, wherein a magnetic field having a direction vertical to the direction of the bending axis of the first flexible base material is applied at the area of the linear polarizing layer; or
- light orientation field induction, wherein a light orientation field having a direction vertical to the direction of the bending axis of the first flexible base material is applied at the area of the linear polarizing layer.

* * * * *